United States Patent [19]
Fujii

[11] Patent Number: 5,973,525
[45] Date of Patent: Oct. 26, 1999

[54] INTEGRATED CIRCUIT DEVICE

[75] Inventor: Yasuhiro Fujii, Kawasaki, Japan

[73] Assignee: Fujitsu Limited, Kawasaki, Japan

[21] Appl. No.: 09/049,383

[22] Filed: Mar. 27, 1998

[30] Foreign Application Priority Data

Oct. 20, 1997 [JP] Japan .................................. 9-287222

[51] Int. Cl.$^6$ ...................................................... H03L 7/06
[52] U.S. Cl. ........................ 327/158; 327/162; 327/149;
331/DIG. 2
[58] Field of Search .................................... 327/156, 244,
327/140–149, 157–169, 237, 236; 331/10–20,
270, DIG. 2, 16, 25; 365/233

[56] References Cited

U.S. PATENT DOCUMENTS

| 5,128,632 | 7/1992 | Erhart | 331/1 A |
| 5,144,254 | 9/1992 | Wilke | 327/107 |
| 5,223,755 | 6/1993 | Richley | 327/158 |
| 5,307,071 | 4/1994 | Arnold | 342/103 |
| 5,339,050 | 8/1994 | Llewellyn | 331/16 |
| 5,420,545 | 5/1995 | Davis | 331/17 |
| 5,604,468 | 2/1997 | Gillig | 331/176 |
| 5,712,884 | 1/1998 | Jeong | 375/375 |

*Primary Examiner*—Timothy P. Callahan
*Assistant Examiner*—Hai L. Nguyen

*Attorney, Agent, or Firm*—Nikaido, Marmelstein, Murray & Oram LLP

[57] ABSTRACT

In the present invention, when a phase comparison circuit, which compares the phase of a reference clock divided by a frequency divider that frequency divides a supplied clock, to that of a variable clock, detects the phase-matching of the two clocks, it generates a phase synchronization detection signal, and this phase synchronization detection signal increases the frequency division ratio of a frequency divider, lowering the frequency of operation of the phase comparator. The present invention is further characterized in that, at reset, when an inactive state becomes an active state, the time required to phase synchronize both clocks is shortened by resetting the above-described phase synchronization detection signal, thereby setting the frequency division ratio of the frequency divider to its original low state, and the frequency of operation of the phase comparator to its original high state. In accordance with the above-described invention, when phase synchronization is detected in an active state, the frequency division ratio of the frequency divider is increased, and the frequency of operation of the phase comparator is lowered, thus curbing power consumption. Then, at reset, this phase synchronization detection signal is reset, thus returning the frequency division ratio of the frequency divider to its original low state, and raising the frequency of phase comparator operation.

10 Claims, 14 Drawing Sheets

CONTROL CLOCK GENERATOR OF THE PREFERRED EMBODIMENT

SYNCHRONOUS DRAM

CONTROL CLOCK GENERATOR

CONTROL CLOCK GENERATOR OF THE PREFERRED EMBODIMENT

VARIABLE DELAY CIRCUIT 2, 5

INPUT BUFFER 1

TIMING CHART OF INPUT BUFFER

FREQUENCY DIVISION RATIO CONTROLLER 10

TIMING CHART OF FREQUENCY DIVISION RATIO CONTROLLER

FREQUENCY DIVIDER 4

ANOTHER EMBODIMENT (PLL)

INTEGRATED CIRCUIT DEVICE

BACKGROUND OF THE INVENTION

1. Field of the Invention

The present invention relates to an integrated circuit device, which is synchronized to the phase of a supplied clock, and which comprises a circuit that generates a control clock for achieving a prescribed circuit operation, and to an integrated circuit device, which comprises a control clock generator capable of speeding up phase synchronized operation at reset while curbing power consumption.

2. Description of the Related Art

Dynamic random access memory (DRAM) are operating at increasingly high speeds. Recently, attention has focused on synchronized DRAM (SDRAM), which inputs data and addresses, performs internal operations, and outputs data in synch with an external clock applied from the system side. One of the characteristics of this SDRAM is that it outputs data at a timing that is either in phase synch with an external clock, or which comprises a fixed phase difference with an external clock. Consequently, it is equipped internally with a control clock generator, which generates a control clock for controlling the data output circuit.

For example, this control clock generator comprises a delay-locked loop (DLL) circuit, compares the phase of a dummy output signal from a variable delay circuit with that of a reference clock, and controls the delay time of the variable delay circuit, which delays the reference clock, so that these phases all match up. The applicant, for instance, proposed an example of a circuit, which generates this control clock in Patent Application No. 8-339988 applied for on Dec. 19, 1996. Or, proposed in Patent Application No. 9-68804 applied for on Mar. 21, 1997.

However, in line with increasingly highspeed clock operation, clock phase comparison is performed too frequently, causing an increase of power consumption in the DLL circuit. Accordingly, a configuration that enables reduced power consumption was proposed in the above-described Patent Application No. 9-68804. Although this configuration makes it possible to reduce power consumption, it incurs problems such as slow DLL circuit operation immediately following activation, i.e. powering ON, and the need for a fixed time until phases are ultimately matched up by continuous phase comparison.

SUMMARY OF THE INVENTION

Accordingly, an object of the present invention is to provide an integrated circuit device, which comprises a control clock generator, which makes it possible to reduce power consumption, and to shorten the time it takes to phase synchronize the clock at the start of operation.

In order to achieve the above-described object in the present invention, when a phase comparison circuit, which compares the phase of a reference clock divided by a frequency divider that frequency divides a supplied clock, to that of a variable clock, detects the phase-matching of the two clocks, it generates a phase synchronization detection signal, and this phase synchronization detection signal increases the frequency division ratio of a frequency divider, lowering the frequency of operation of the phase comparator. The present invention is further characterized in that, at reset, when an inactive state becomes an active state, the time required to phase synchronize both clocks is shortened by resetting the above-described phase synchronization detection signal, thereby setting the frequency division ratio of the frequency divider to its original low state, and the frequency of operation of the phase comparator to its original high state.

In accordance with the above-described invention, when phase synchronization is detected in an active state, the frequency division ratio of the frequency divider is increased, and the frequency of operation of the phase comparator is lowered, thus curbing power consumption. Then, at reset, this phase synchronization detection signal is reset, thus returning the frequency division ratio of the frequency divider to its original low state, and raising the frequency of phase comparator operation.

The present invention is an integrated circuit device, comprising a phase comparator, which compares the phase of a reference clock to that of a variable clock, and a frequency divider, which generates the reference clock by frequency dividing a supplied clock, wherein: the phase comparator generates a phase synchronization detection signal when the phase of the reference clock matches the phase of a variable clock, the phase of which changes in accordance with the results of phase comparison; the frequency divider divides the supplied clock by a first frequency division ratio, and changes to a second frequency division ratio that is higher than the first frequency division ratio in response to the phase synchronization detection signal; and at a reset when an inactive state is changed to an active state, the phase synchronization detection signal is reset so that the frequency divider performs frequency division using the first frequency division ratio, and the phase comparator performs phase comparison with a higher frequency at the reset.

DESCRIPTION OF THE PREFERRED EMBODIMENTS

Embodiments of the present invention are described below with reference to the figures. However, these embodiments do not limit the technological scope of the present invention.

Figure 1:
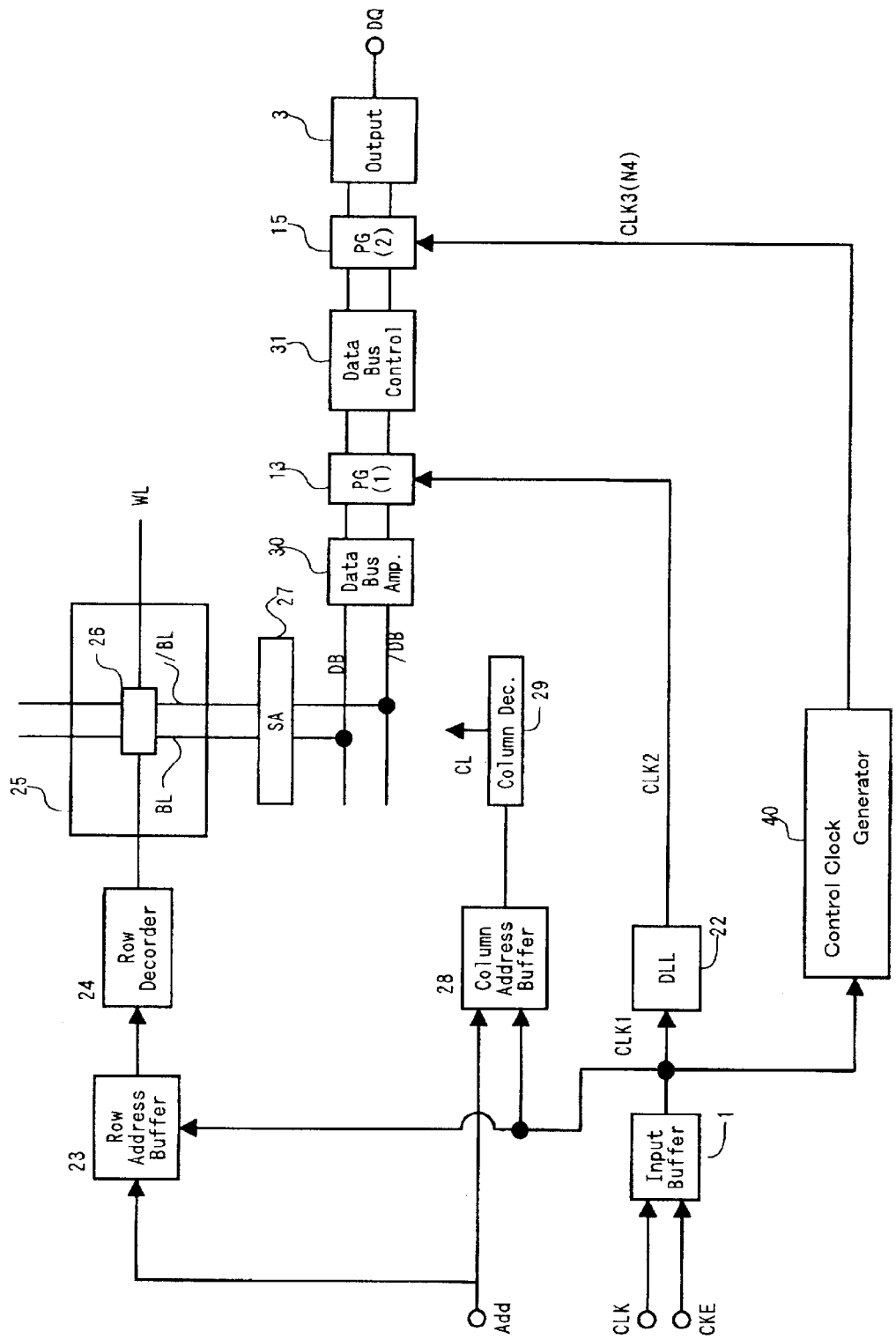
FIG. 1 depicts the overall architecture of an SDRAM, which comprises a control clock generator of this embodiment.

FIG. 1 depicts the overall architecture of an SDRAM, which comprises a control clock generator of this embodiment. In this example, the column circuitry 20 is configured to a pipelined structure. Row addresses and column addresses are supplied via a common address terminal Add, and row addresses supplied in synch with an external clock CLK are captured by a row address buffer 23, amplified, and supplied to a row decoder 24. A word line WL selected by the row decoder 24 is driven, and a memory cell 26 is selected. Memory cell 26 data is outputted to one of the bit lines BL, /BL, and amplified in a sense amplifier 27 together with a reference voltage of the other bit line. This completes the operation of the row address side of the circuit.

Thereafter, a column address is supplied to the address terminal Add in synch with the external clock CLK, and is amplified by a column address buffer 28. This address signal is decoded by a column decoder 29, and a sense amplifier selected from among the sense amplifiers 27 by a column gate selection signal CL is connected to a pair of data bus lines DB, /DB. Then, data in the pair of data bus lines DB, /DB is further amplified by a data bus amplifier 30. Of the column circuitry 20, the circuitry up to this point corresponds, for example, to a first stage pipeline circuit.

The external clock CLK is amplified one time by a clock input buffer 1, and applied as a clock CLK1 to a delay locked loop (DLL) circuit 22, which is an internal clock generator. In the DLL circuit 22, an internal clock CLK2, comprising a fixed phase relative to the clock CLK1, is generated. The internal clock CLK2 is supplied to a pipeline gate 13, and the pipeline gate 13 is opened in synch with the internal clock CLK2.

Further, a data bus controller 31 corresponds to a second stage pipeline circuit, and performs prescribed control operations, such as data bus selection. Then, pipeline gate 15 is opened in synch with a control clock CLK3, and the data bus controller 31 output signal is applied to an output circuit 3. Then, data read out from output circuit 3 is outputted to a data output terminal DQ.

The internal clock CLK1 is also applied to a control clock generator 40. The control clock generator 40 comprises a DLL circuit described below, and generates the control clock CLK3, which controls output data timing.

Figure 2:
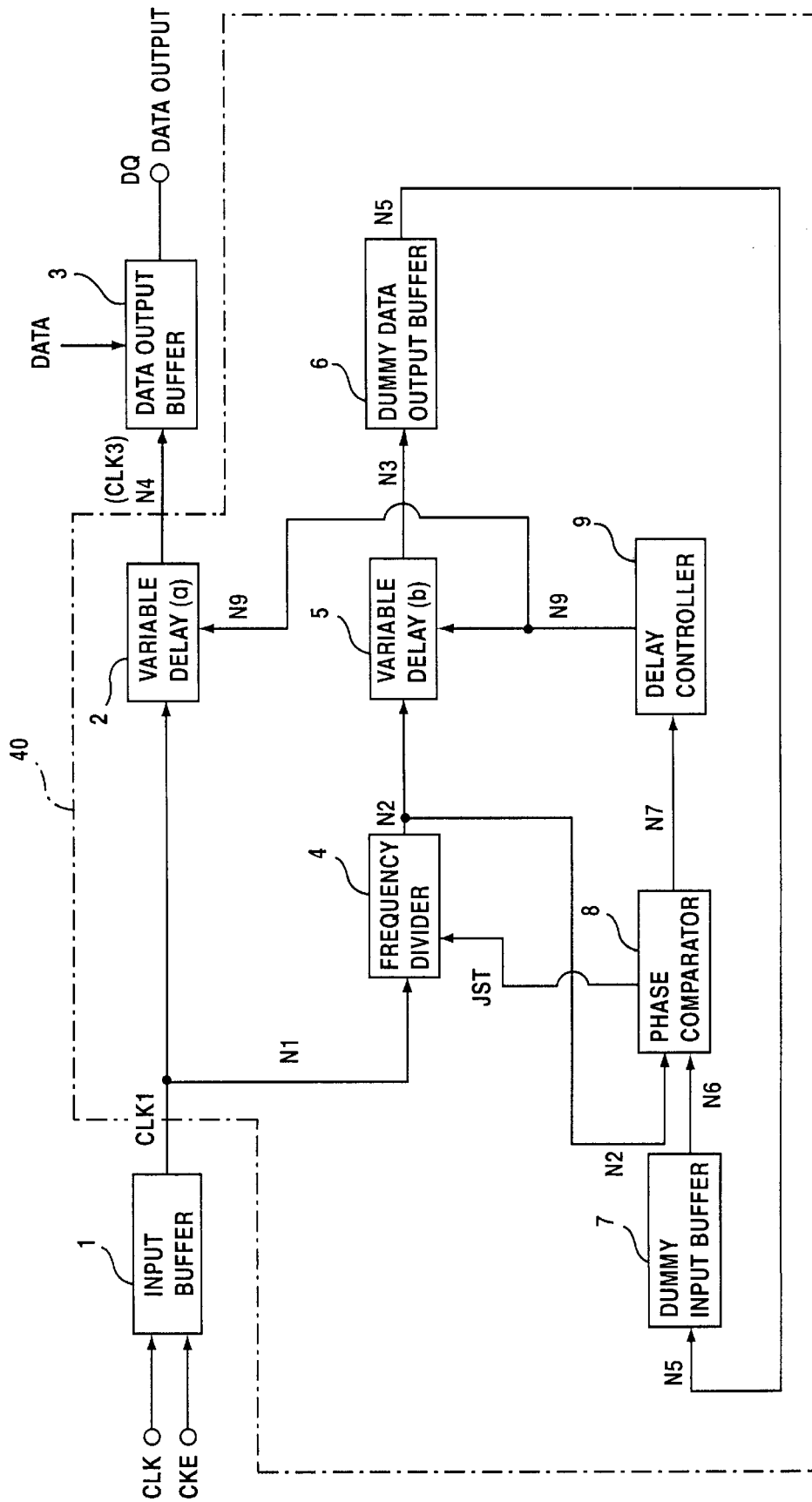
FIG. 2 is a block diagram of an example of a control clock generator.

FIG. 2 is a block diagram of an example of a control clock generator 40. FIG. 2 depicts an input buffer 1, to which an external clock CLK is supplied, an output buffer 3, which outputs data output DQ, and a control clock generator 40, to which an internal clock CLK1 (N1) generated from the input buffer 1 is applied as a reference clock, and which generates in phase synch with the reference clock CLK1 (N1) a control clock CLK3 (N4) for outputting data output DQ. The control clock CLK3 (N4) can also be applied to an internal gate inside the data output buffer 3, or, as depicted in FIG. 1, it can also be supplied to a pipeline gate 15 at a stage prior to the output buffer 3.

The control clock generator 40 comprises a frequency divider 4, which divides the internal clock CLK1 (N1). The output clock N2 of the frequency divider 4 is applied to the reference input side of a phase comparator 8. The output clock N2 of the frequency divider 4 is also applied to the variable clock input side of the phase comparator 8 via a variable delay circuit 5, as well as a dummy data output buffer 6 and a dummy input buffer 7. The phase comparison result signal N7 of the phase comparator 8 is supplied to a delay controller 9, and the delay controller 9 generates a delay control signal N9 so as to match the phases of the two input clocks N2 and N6, and supplies this delay control signal N9 to the variable delay circuit 5.

The above-described phase comparator 8, delay controller 9, variable delay circuit 5, dummy data output buffer 6 and dummy input buffer 7 comprise a DLL circuit. Then, as described above, the delay time of the variable delay circuit 5 is controlled by the DLL circuit so as to phase match clocks N2 and N6. Therefore, the phase of the dummy output N5 of the dummy data output buffer 6 is controlled so as to match the phase of the external clock CLK.

The delay control signal N9 generated as described above is also supplied to a variable delay circuit 2, to which an internal clock CLK1 is supplied and propagated. Then, the output clock N4 of this variable delay circuit 2 is applied to the data output buffer 3 as the control clock CLK3. Because variable delay circuit 2 and variable delay circuit 5 have identical circuit architectures, and comprise the same delay characteristic in accordance with the same delay control signal N9, the phase of the data output DQ matches the phase of the external clock CLK. Although not depicted in FIG. 2, when a phase shift circuit, which shifts the phase of the internal clock CLK1 (N1) by a fixed timing, is fabricated either before or after the frequency divider 4, or inside the frequency divider 4, the phase of the data output DQ is controlled so that it is slower than the external clock CLK by the fixed timing.

Now, the above-described frequency divider 4 frequency divides the highspeed internal clock CLK1 to a 1/N frequency. Then, this frequency divided clock N2 is applied to the phase comparator 8 as a reference clock. By performing frequency division, it becomes possible to lower the frequency of phase comparison operations of the phase comparator 8, and to hold down power consumption.

The phase comparator 8 compares the phases of both clocks N2, N6, and determines if the phase of the variable clock N6 is faster or slower than, or matches that of the reference clock N2. As a result of that determination, a phase comparison result signal N7, which indicates whether the phase of the variable clock N6 is to be delayed, speeded up or left as-is, is generated.

In general, the above-described DLL circuit operates at reset, when an active state is applied by a clock enable signal CKE, so as to match the phase of the external clock CLK with the phase of the data output DQ, or to match them with the fixed timing shift. Then, once the phases of both sides match, with few exceptions, the phases of both sides shift very little. Therefore, once the DLL circuit achieves a locked state, it is desirable to detect that phase match, and to greatly change the frequency division ratio of the frequency divider 4 to further reduce the frequency of operation of the phase comparator 8. The power consumption of the phase comparator 8 can be greatly curbed as a result. Consequently, in the example depicted in FIG. 2, when the phase comparator 8 detects the phase matching of both input clocks, it applies a phase synchronization detection signal JST to the frequency divider 4.

However, when memory is in an inactive state, and transitions to a reactivation state after a fixed period of time, a phase synchronization detection signal JST in the state prior to memory becoming an inactive state is used as-is, and controls the frequency division ratio of the frequency divider 4 so that it becomes larger. However, in the active state prior to the inactive state, the temperature inside the integrated circuit is in a high state, and even if a locked state is achieved in that state, often times an unlocked state develops when there is a low temperature state upon reactivation. When this happens, the phase synchronization detection signal JST maintained by the phase comparator 8 causes the frequency division ratio of the frequency divider 4 to remain in a high state, and the frequency of phase comparison operations of the phase comparator 8 remains low. Therefore, a long period of time is required before a locked state is achieved.

Figure 3:
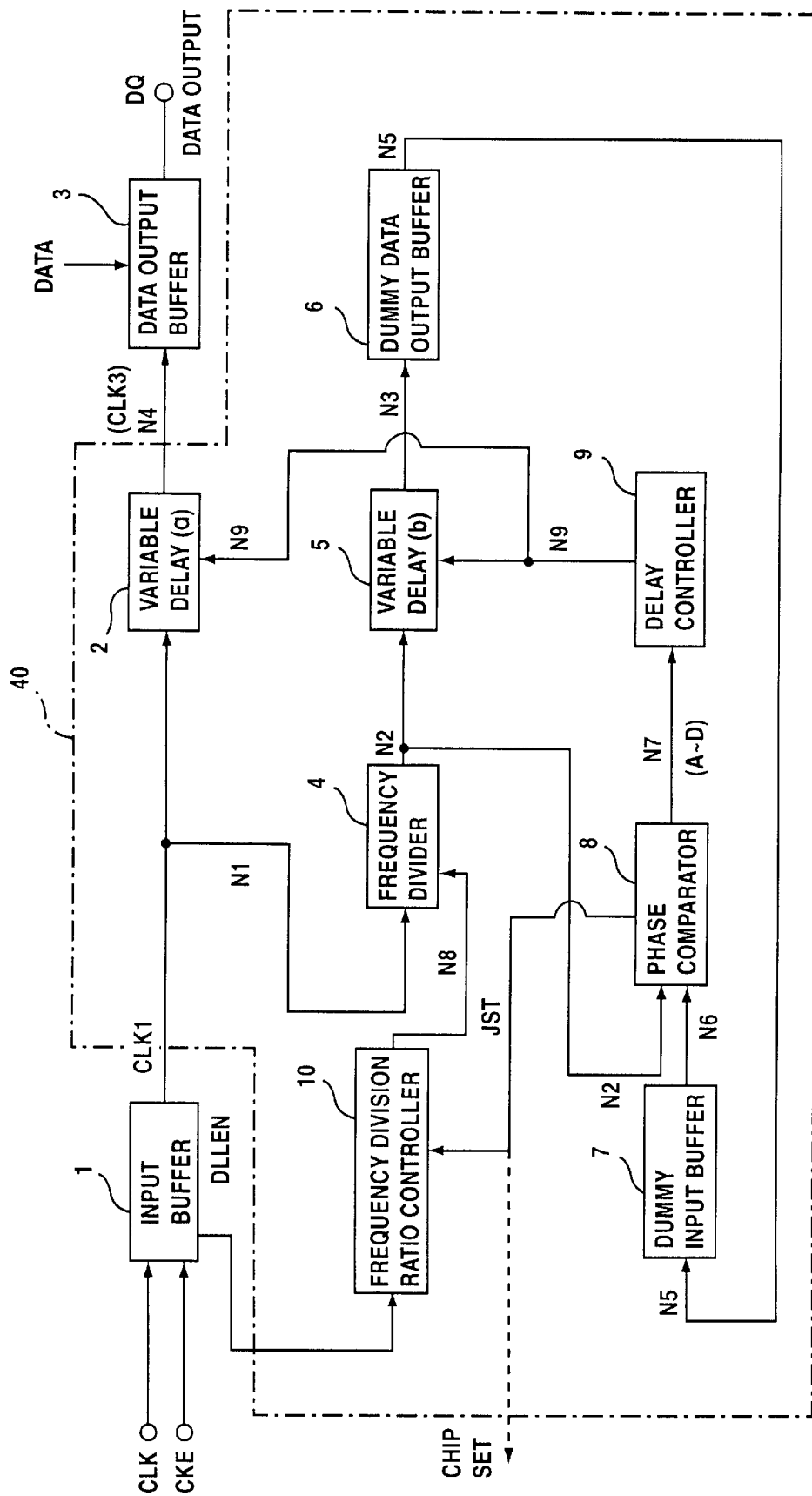
FIG. 3 is a block diagram of a control clock generator of an embodiment of the present invention.

FIG. 3 is a block diagram of a control clock generator of an embodiment of the present invention. Identical reference numbers have been given to those parts which correspond to parts depicted in FIG. 2. To solve for the problems pointed out above with reference to FIG. 2, the control clock generator 40 depicted in FIG. 3 comprises a frequency division ratio controller 10. This frequency division ratio controller 10 is supplied with a phase synchronization detection signal JST from a phase comparator 8, and a DLL enable signal DLLEN from an input buffer 1, and generates a control signal N8, which controls the frequency division ratio of a frequency divider 4. When DLL enable signal DLLEN phase-synchronized a clock enable signal CKE is in an active state, the frequency division ratio controller 10 increases the frequency division ratio of the frequency divider 4 in response to the phase synchronization detection signal JST from the phase comparator 8. And when the DLL enable signal DLLEN changes from an inactive state to an active state, the frequency division ratio controller 10 decreases the frequency division ratio of the frequency divider 4 regardless of the state of the phase synchronization detection signal JST from the phase comparator 8. More specifically, the frequency division ratio controller 10 forcibly resets the phase synchronization detection signal JST supplied thereof and applies that reset signal N8 to the frequency divider 4.

As a result, when the DLL enable signal DLLEN is in an active state, identical to FIG. 2, the DLL circuit is responsive to the phase synchronization detection signal JST, and can raise the frequency division ratio of the frequency divider 4, lower the frequency of comparisons performed by the phase comparator 8, and hold down on power consumption. Then, when the DLL enable signal DLLEN changes from an inactive state to an active state, the control signal N8 applied to the frequency divider 4 is reset regardless of the phase synchronization detection signal JST, which is based on the state prior to inactivation, thus lowering the frequency division ratio of the frequency divider 4, increasing the frequency of comparison operations of the phase comparator 8, and enabling the highspeed transition to a phase-synchronized locked state.

Also, as indicated by the broken line depicted in FIG. 3, by externally outputting the phase synchronization detection signal JST from a chipset terminal, it is possible to notify the system side of the above-described phase-synchronized state. Therefore, after confirming the signal from this chipset terminal, the system side is able to apply normal input data and address signals, and to perform accurate operational control.

Next, specific examples are given of the circuitry involved in the variable delay circuits 2, 5, delay control circuit 9 and phase comparator 8 which constitute the aforementioned DLL circuit.

Figure 4:
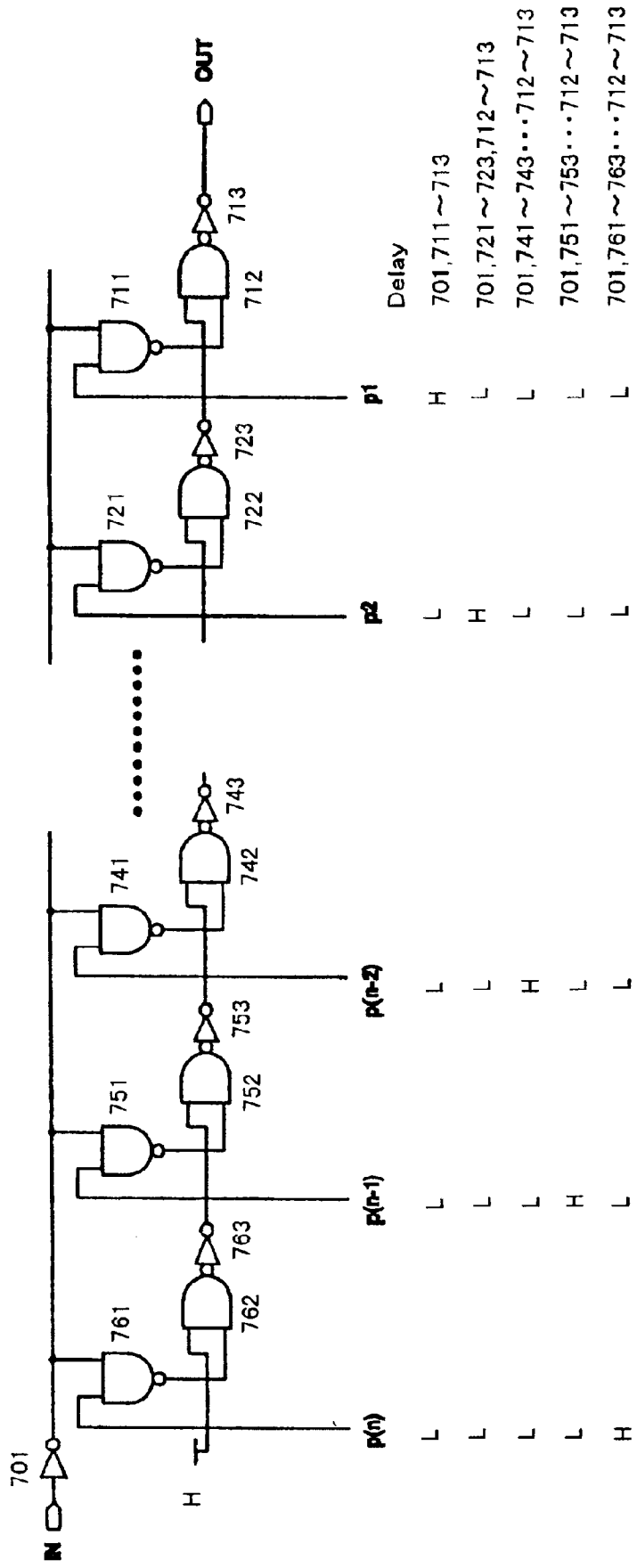
FIG. 4 is a circuit diagram showing one example of a variable delay circuit.

FIG. 4 is a circuit diagram showing one example of a variable delay circuit. The variable delay circuits 2, 5 have the same circuit structure. Their delay times are selected by means of delay control signals p1–p(n)(N9 in FIG. 3). These variable delay circuits receive a clock via an input terminal IN, delay it for a prescribed time period, and then output it to the output terminal OUT. In this example, there are n stages of delay circuits: the first stage comprises NAND gates 711, 712 and an inverter 713, the second stage comprises NAND gates 721, 722 and an inverter 723, and the subsequent stages are constructed similarly, up to the nth stage, which comprises NAND gates 761, 762 and inverter 763.

One of the delay control signals p1–p(n) takes a level H, and all the others take a level L. The one NAND 711, 721, ..., 761 corresponding to the delay control signal p at level H is opened by this signal and the clock supplied to its input IN is allowed to pass. The other NANDs 711, 721, ..., 761 corresponding to the other delay control signals at level L are all closed by these signals. As shown in the diagram, NAND 711 opens when the delay control signal p1 is at level H, and a delay path is formed from the input terminal IN to the output terminal OUT, via the inverter 701, NANDs 711, 712, and inverter 713. Therefore, a delay of four gate stages is obtained.

When the delay control signal p2 is at level H, NAND 721 opens. Since both inputs to gate 762 are at level H, the output of inverter 763 is level H and similarly, the outputs of inverters 753, 743, ... are also level H. Therefore, NAND 722 will also be in an opened state. As a result, a delay path is formed from the input terminal IN to the output terminal OUT via inverter 701 and gates 721 - 723, 712, 713. Accordingly, a delay of six gate stages is obtained.

As shown in FIG. 4, each time the delay control signal p at level H moves to the left, the number of gates in the delay path increases by two. When the delay control signal p(n) is at level H, the delay path comprises 2+2n gate stages.

Figure 5:
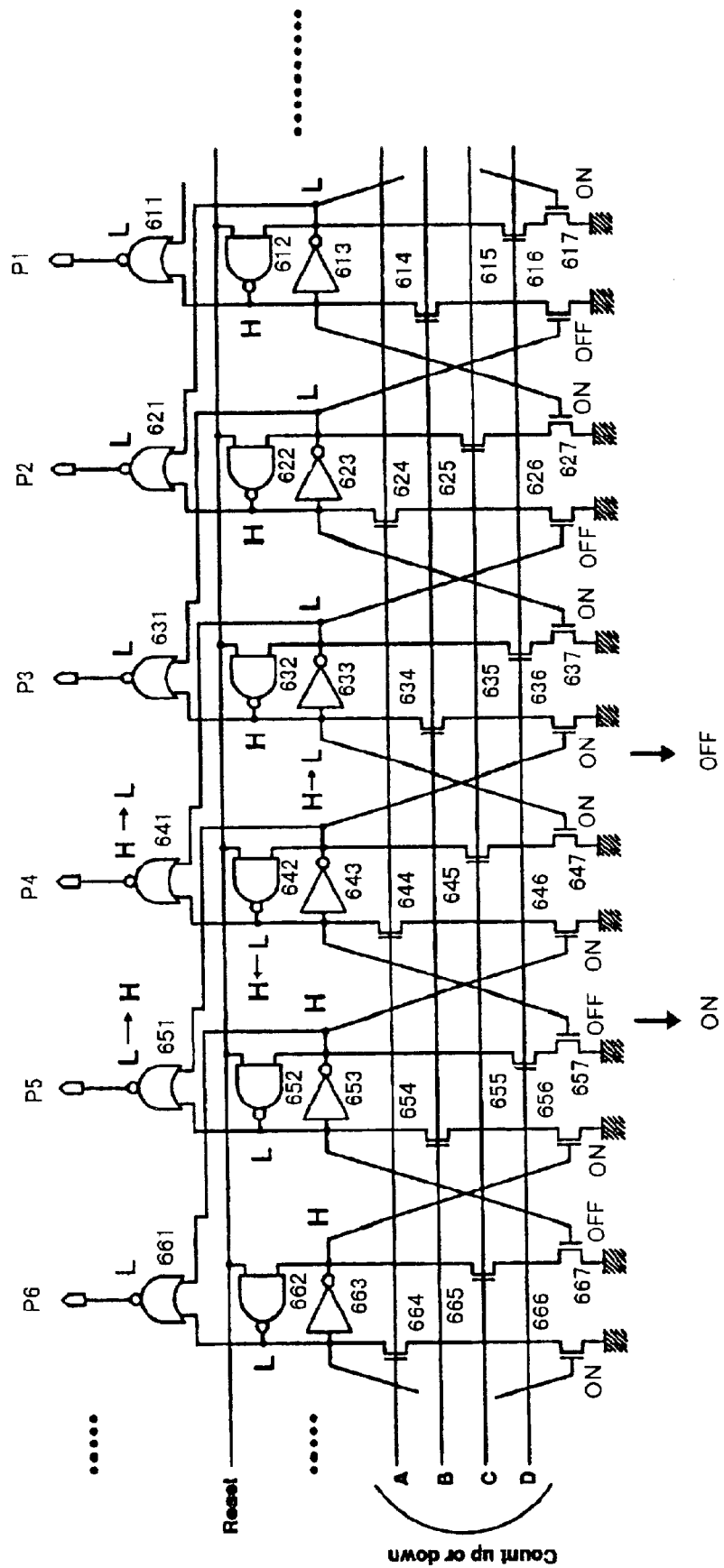
FIG. 5 illustrates a delay control circuit.

FIG. 5 illustrates a delay control circuit 9. In FIG. 5, a portion of a delay control circuit is shown, and for the purpose of explanation, a part of the delay control signal N9, p1–p6 for the variable delay circuits are illustrated. Detection signals A–D, representing phase comparison result signal (N7) from the phase comparator, are supplied to this delay control circuit; the delay control signal p at level H is shifted towards the right by signals A and B, and it is shifted towards the left by signals C and D.

The delay control circuit 9 constitutes a shift register. Each delay control circuit stage is provided respectively with a latch circuit comprising, in the case of the first stage, for example, a NAND gate 612 and an inverter 613. It is also provided with transistors 614, 615, which reverse the state of the latch circuit 612, 613 unconditionally by means of detection signals A–D which are phase comparison result (N7 in FIG. 3). Transistors 616, 617 are provided such that the latch circuit is not reversed by transistors 614, 615 when it is not intended to be reversed. The circuits in the $2^{nd}$ stage to $6^{th}$ stage are constructed similarly. The transistors are all N-channel type transistors.

Supposing that the fourth stage output p4 is at level H, then the other outputs will all be at level L. The states of the latch circuits at each stage are indicated by the labels H and L in FIG. 5. Namely, in the latch circuits of the first to third stages, the NAND output is level H and the inverter output is level L, whereas in the latch circuits of the fourth to sixth stages, the NAND output is level L and the inverter output is level H. Therefore, of the transistors connected to ground, transistors 617, 627, 637, 647, 646, 656, 666 each assume an "on" state. In other words, the two transistors at the boundary of the latch state, namely, transistor 647 of the fourth stage circuit and transistor 636 of the third stage circuit, assume an "on" state, and their latch stage can be reversed by means of detection signal B or C.

Therefore, if it is supposed that level H is supplied to detection signal C, then transistor 645 turns on, and the output of inverter 643 is driven unconditionally from level H to level L. As a result, the output from NAND gate 642 also switches from level L to level H and this state is latched. Since the output from NAND gate 642 assumes level H, the output p4 from NOR gate 641 assumes level L and, in its place, the output p5 from NOR gate 651 is switched to level H due to the output from inverter 643 having changed to level L. Accordingly, the delay control signal at level H shifts from p4 to p5. As described in FIG. 4, by shifting the delay control signal p at level H towards the left, the delay path of the variable delay circuit increases in length and hence the delay time is controlled such that it becomes longer.

If, on the other hand, it is supposed that detection signal B is at level H, then, in a similar operation to that described above, the output of NAND gate 632 in the third stage latch circuit is unconditionally switched to level L, and the output of inverter 633 is switched to level H. Consequently, output p3 assumes level H. Thereby, the delay path of the variable delay circuit is shortened and hence the delay time is controlled such that it becomes shorter.

When output p5 or p3 assumes level H, the output at level H is shifted to the right or the left by means of detection signal A or D. In other words, detection signals A and B shift the level H output to the right and detection signal C and D shift the level H output to the left. Furthermore, detection signals A and D shift the output when an odd-numbered output p1, p3, p5 is at level H, and detection signals B and C shift the output when an even-numbered output p2, p4, p6 is at level H.

Figure 6:
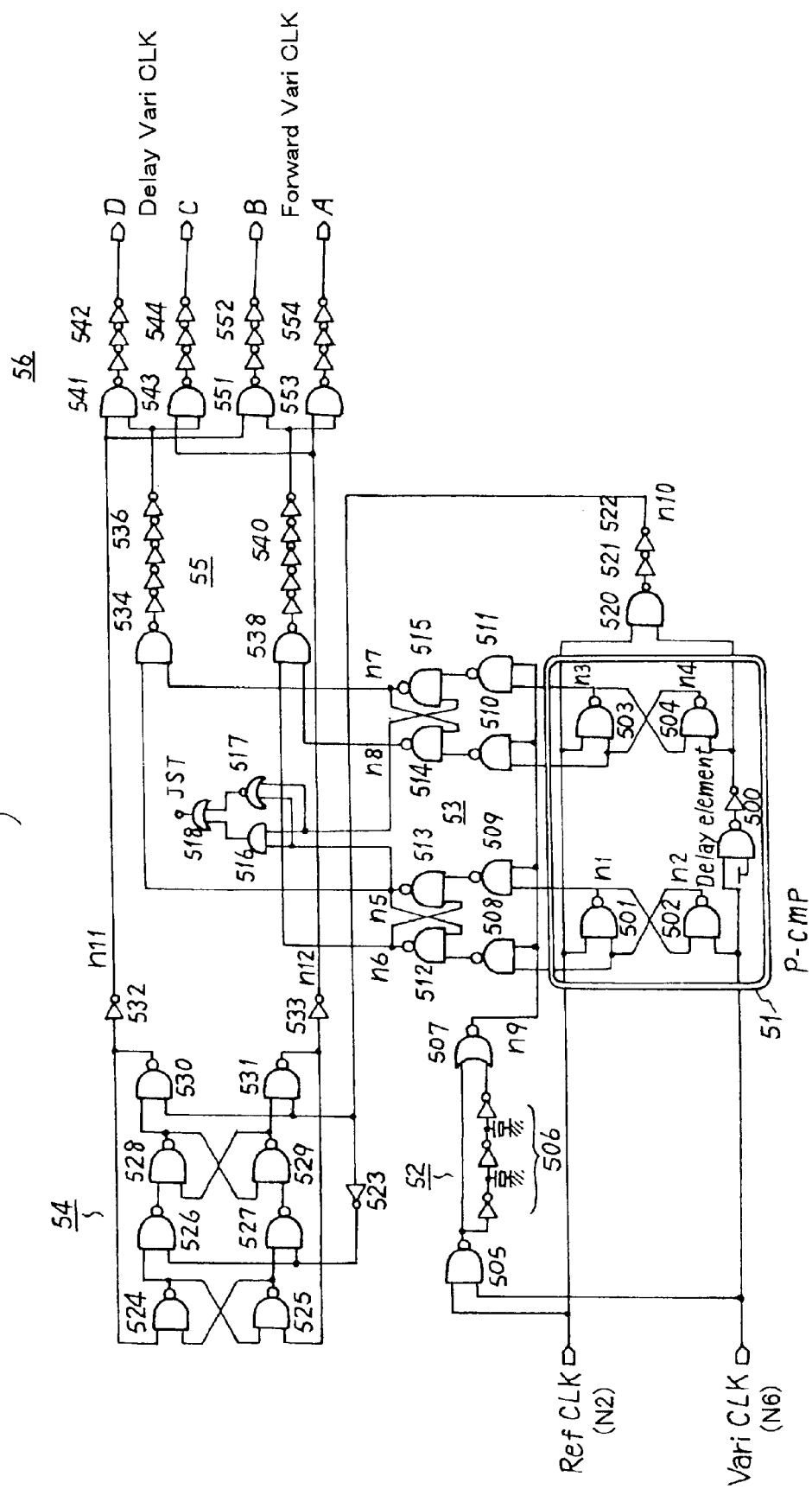
FIG. 6 is a detailed circuit diagram of a phase comparator.

FIG. 6 is a detailed circuit diagram of a phase comparator 8. This phase comparator comprises a phase detecting section 51 which detects the relationship between the phase of a variable clock VariCLK and a reference clock RefCLK. This phase comparing section 51 comprises two latch circuits constituted by NAND gates 501, 502 and 503, 504, and it detects when the phase of the variable clock VariCLK is (1) advanced by a prescribed time period or more; (2) in a phase difference relationship within a prescribed time period; or (3) delayed by a prescribed time period or more; with respect to the reference clock RefCLK. The three states described above are detected by a combination of detection outputs n1–n4.

The sampling pulse generating section 52 comprises a NAND gate 505, delay circuit 506 and NOR gate 507, and when the two clocks, RefCLK and VariCLK are both at level H, a sampling signal is output to node n9. In accordance with this sampling signal n9, a sampling latch circuit section 53 samples detection outputs n1–n4 by means of sampling gates 508–511, and it latches them by means of a latch circuit comprising NANDs 512, 513 and 514, 515. Therefore, the sampled detection outputs n1–n4 are latched respectively to nodes n5–n8.

A one-into-two frequency divider 54 having a JK flip-flop structure receives a detection pulse n10 when NAND gate 520 detects that both clocks VariCLK and RefCLK are at level H, and it divides the frequency of this detection pulse n10 in half, to generate reverse phase pulse signals n11 and n12. The decoder section 55 decodes the sampled and latched signals from nodes n5–n8: if the variable clock VariCLK is ahead of the reference clock RefCLK, the output of inverter 536 is set to level H; if the two clocks match in phase, the output of inverters 536 and 540 are set to level; and if the variable clock VariCLK is behind the reference clock RefCLK, then the output of inverter 540 is set to level H. The output circuit section 56 outputs a detection signal A–D in response to the reverse phase pulse signals n11 and n12, according to the output of the decoder section 55.

Further, an AND gate 516, NOR gate 517 and OR gate 518 receiving the nodes n5 and n8 of the latch circuit 508, 510 as inputs are provided so that a phase synchronization detection signal JST is generated when two nodes n5 and n8 are both level H or level L.

Figure 7:
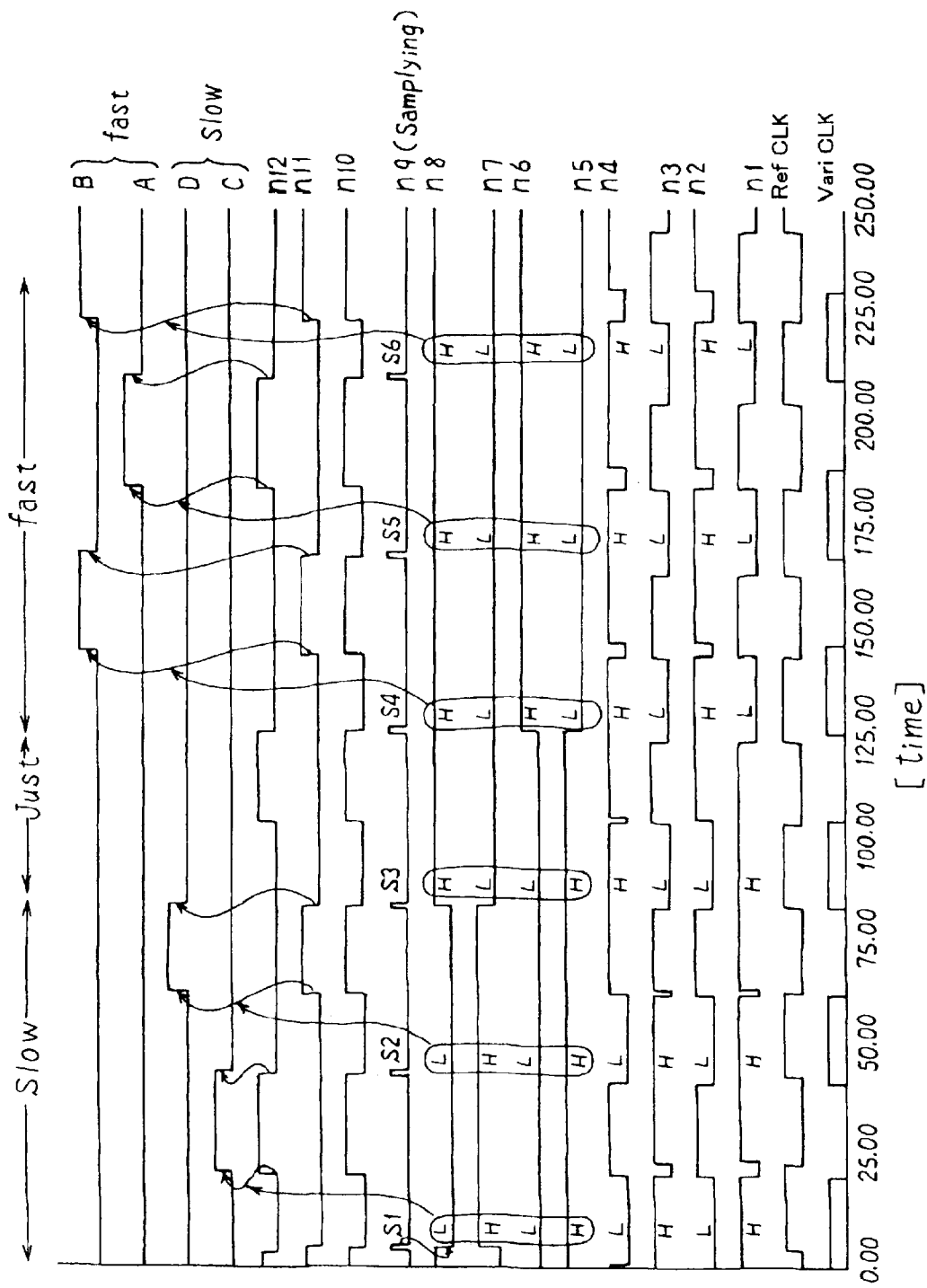
FIG. 7 is a timing chart showing the operation of FIG. 6.

FIG. 7 is a timing chart showing the operation of FIG. 6. This diagram shows in sequence a state where the variable clock VariCLK is ahead of the reference clock refCLK, a state where the two clocks are matched in phase, and a state where the variable clock VariCLK is behind the reference clock RefCLK. In other words, when the sampling pulse is S1 or S2, the variable clock VariCLK is ahead, so when this is detected, detection signal C is output at level H in response to pulse n12, and detection signal D is output at level H in response to pulse n11. When the sampling pulse is S3, the phases are matched and all the detection signals A–D are set to level L. Furthermore, in the case of sampling pulses S4, S5, S6, the variable clock VariCLK is behind, so when this is detected, detection signal B or detection signal A are output at level H, in response to pulse n11 or pulse n12, respectively. The operation of the foregoing is now described in sequence.

Sampling Pulse S1

In this time period, since the variable clock VariCLK is ahead, then from a state where both clocks VariCLK and RefCLK are at level L, the variable clock VariCLK first switches to level H, and node n2 is latched at level L and node n1 is latched at level H. The NAND and inverter 500 form a delay element which delays the variable clock VariCLK by a prescribed time period, and then at NANDs 503 and 504, similarly, node n3 is latched at level H, and node n4 is latched at level H. Thereupon, at the timing at which both clocks VariCLK and RefCLK assume level H, the sample pulse generating section 52 generates a sampling pulse n9 having a width equal to the delay time of delay circuit 506, the latched states in phase comparator 51 are sampled, and these states are latched by the latch section 53. In other words, the states of nodes n1–n4 are transmitted to nodes n5–n8.

Thereupon, a pulse n10 is generated at the timing at which both clocks VariCLK and RefCLK take level H. In the frequency dividing circuit 54, the latch circuit of NANDs 524 and 525, and the latch circuit of NANDs 528, 529 are coupled to gates 526, 527 and gates 530, 531, and these gates are opened by the reversed or non-reversed pulse from n10. Therefore, the pulse n10 is frequency divided by one half into the signals at nodes n11 and n12.

In the decoder section 55, the output of inverter 536 is set to level H and the output of inverter 540 is set to level L. Therefore, in response to pulse n12, the level H output from inverter 536 sets detection signal C to level H, via NAND 543 and inverters 544. Since detection signal C is set to H, the level H output in the shift register is shifted towards the left, and the delay path of the variable delay circuit becomes longer. As a result, the variable clock VariCLK is controlled such that it is slowed down. And, since the nodes n5, n8 are level H, L, the phase synchronization detection signal JST is level L.

Sampling Pulse S2

Similarly to the foregoing, the phase comparator 51 detects that the variable clock VariCLK is ahead, and detection signal D is set to level H in response to pulse n11. Therefore, the level H output forming the delay control signal N9 (P~Pn) of the delay control circuit is shifted similarly towards the left, and the delay path of the variable delay circuit becomes even longer.

Sampling Pulse S3

At the timing that sampling pulse S3 is output, the phases of both clocks VariCLK and RefCLK are substantially matching. If there is a phase difference within the delay time of the delay element 500, and the variable clock VariCLK is a little ahead, the various pulses will be:

n1=H, n2=L, n3=L, n4=H n5=H, n6=L, n7=L, n8=H

This state is illustrated in FIG. 7. If there is a phase difference with the delay time of the delay element 500, and the variable clock VariCLK is a little behind, the pulses will be:

n1=L, n2=H, n3=H, n4=L n5=L, n6=H, n7=H, n8=L

In either case, the pulses are decoded by the decoder section 55 and the output of both inverters 536 and 540 is set to level L, and the detection outputs A–D are all set to level L. As a result, there is no change in the state of the delay control circuit, and hence no change in the delay time of the variable delay circuit. Further, the phase synchronization detection signal JST is level H. This state is hold by the latch circuits 508, 510.

Sampling Pulses S4, S5, S6

When this happens, the variable clock VariCLK is slow. Therefore, the latch states of the phase comparator 51 are:

n1=L, n2=H, n3=L, n4=H and as a result, the sampled latch 53 also becomes:

n5=L, n6=H, n7=L, n8=H

This state is decoded by the decoder 55, making the output of inverter 536 L level, and the output of inverter 540 H level. Therefore, in response to pulses n11 and n12, detection signals B and A, respectively, become H level. As a result, the H level signal p of the delay control signal N9 of the delay controller shifts to the right, thereby shortening the delay path of the variable delay circuit, and shortening the delay time. Consequently, the variable clock VariCLK is controlled in the direction in which it speeds up. The phase synchronization detection aft signal JST is L level at this time.

Figure 8:
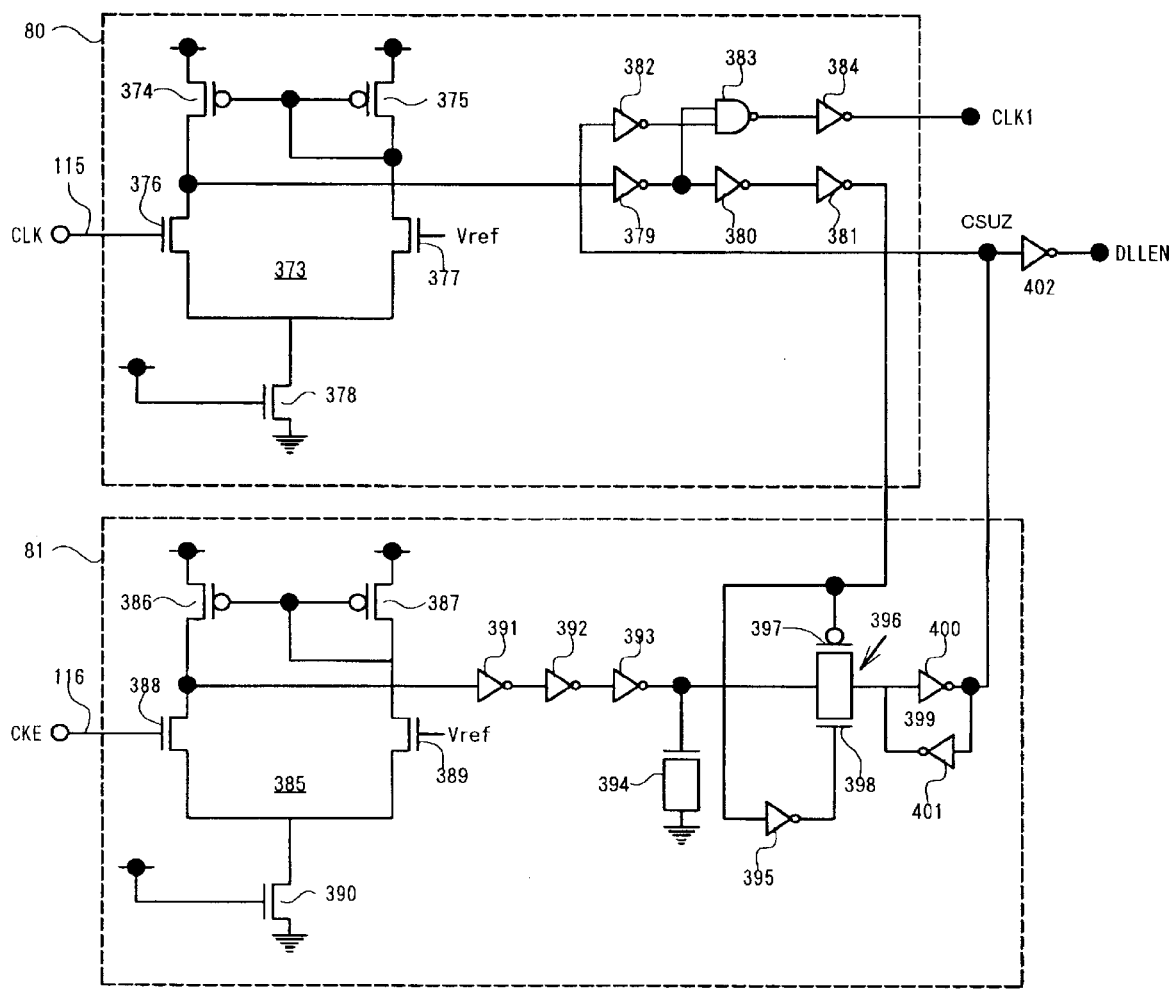
FIG. 8 is a circuit diagram of an input buffer.

FIG. 8 is a circuit diagram of an input buffer 1. The input buffer 1 is comprised of an external clock CLK input buffer 80 and a clock enable signal CKE input buffer 81, which indicates that the external clock CLK is valid. When the clock enable signal CKE is an active state H level, this input buffer 1 generates an internal clock CLK1 in response to the external clock CLK, and when the clock enable signal CKE is an inactive state L level, this input buffer 1 does not generate an internal clock CLK1.

As depicted in FIG. 8, the external clock CLK input buffer 80 comprises a differential circuit 373, comprising P-type transistors 374, 375 and N-type transistors 376, 377, 378, and inverters 379–382, 384 and a NAND gate 383. And the clock enable signal CKE input buffer 81 comprises a differential circuit 385, comprising P-type transistors 386, 387 and N-type transistors 388–390, and inverters 391–393, a capacitor 394, a transfer gate 396 and a latch circuit 399 comprised of inverters 400, 401.

Figure 9:
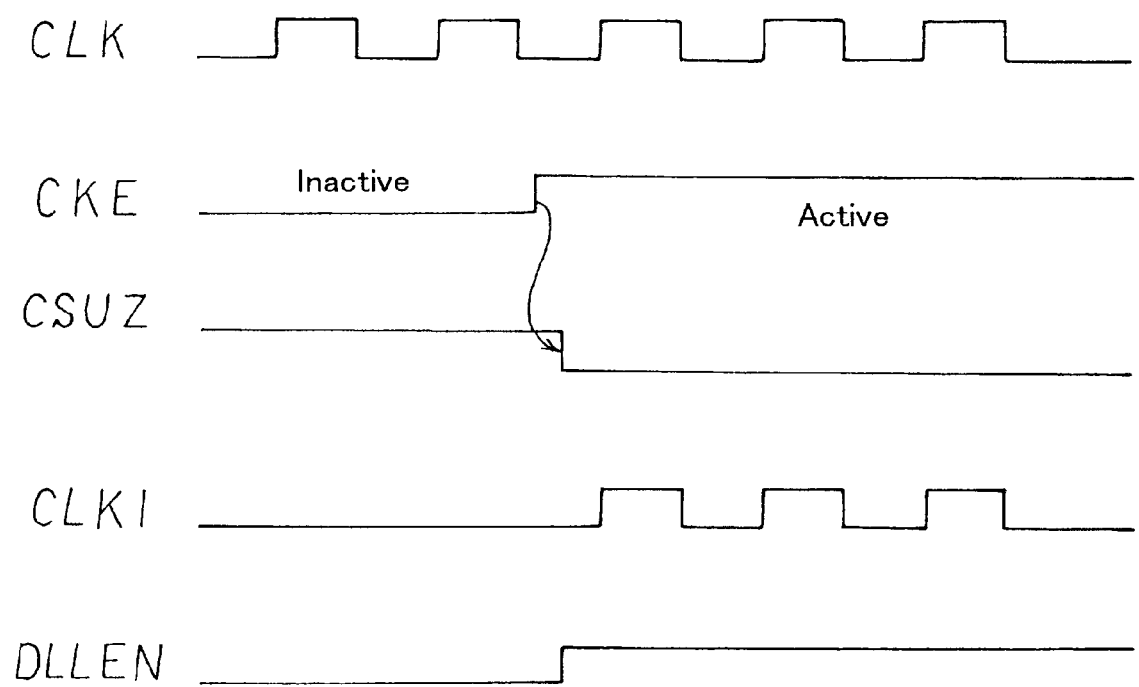
FIG. 9 is an operational timing chart for the input buffer depicted in FIG. 8.

FIG. 9 is an operational timing chart for the input buffer depicted in FIG. 8. The timing chart in FIG. 9 shows what happens when a clock enable signal CKE transitions from an inactive state L level to an active state H level. When the external clock CLK is L level, transfer 376 is non-conductive, setting the output of inverter 381 to L level. As a result, transfer gate 396 conducts. The state of the clock enable signal CKE at that time is held in latch 399. When the clock enable signal CKE is L level, transistor 388 becomes non-conductive, and the output of inverter 400 retains H level. That is, the signal CSUZ becomes H level, the output of NAND gate 383 is forced to H level and the internal clock CLK1 is forced to L level. Therefore, while the clock enable signal CKE is at L level, an internal clock CLK1 is not generated.

Accordingly, when the clock enable signal CKE becomes an active state H level, when the external clock CLK is L level, the transfer gate 396 conducts and the latch 399 latches the state of the clock enable signal CKE. As a result, the signal CSUZ becomes L level, and an internal clock CLK1, which is responsive to the external clock CLK, is generated via NAND gate 383.

Furthermore, a DLL enable signal DLLEN is generated via inverter 402 in response to signal CSUZ. That is, the DLL enable signal DLLEN is a control signal phase-synchronized to the clock enable signal CKE, and when memory itself is in an active state, the DLL enable signal DLLEN become H level.

Figure 10:
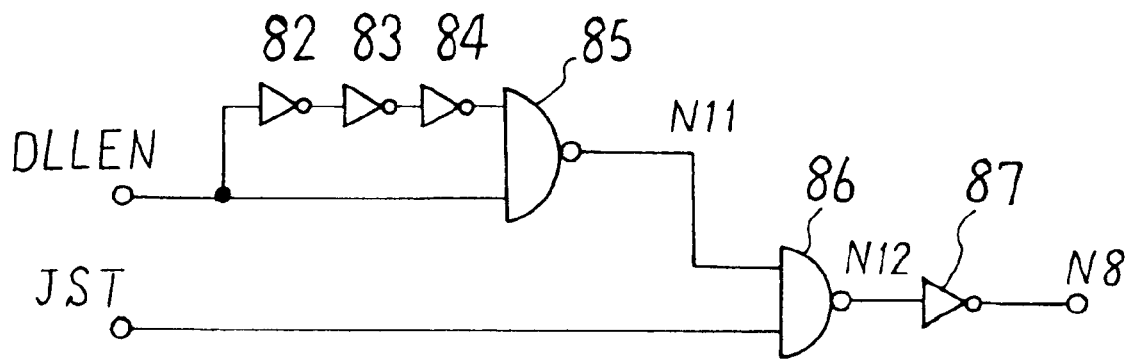
FIG. 10 is a circuit diagram of a frequency division ratio controller 10.
Figure 11:
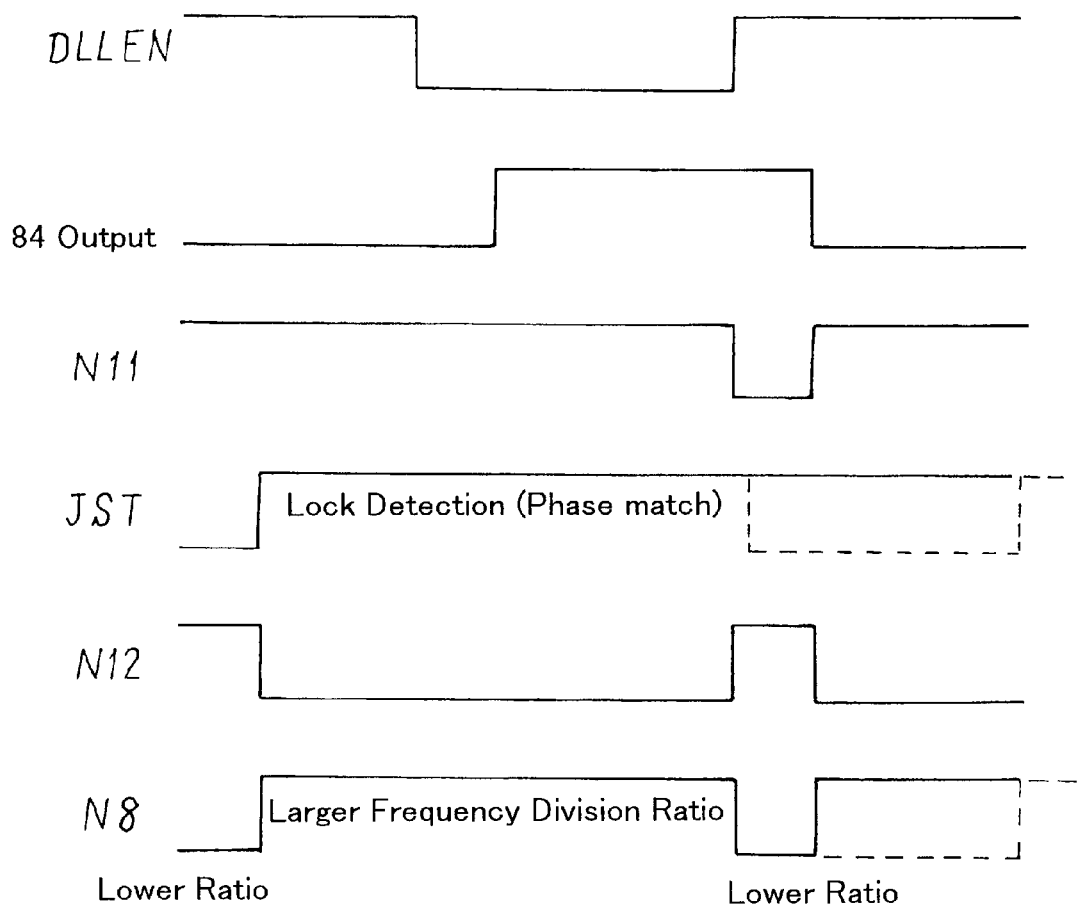
FIG. 11 is a timing chart of the frequency division ratio controller depicted in FIG. 10.

FIG. 10 is a circuit diagram of a frequency division ratio controller 10. And FIG. 11 is a timing chart of the frequency division ratio controller depicted in FIG. 10. The frequency division ratio controller 10 comprises inverters 82–84, 87 and NAND gates 85, 86, and is supplied with a DLL enable signal DLLEN, and a phase synchronization detection signal JST, which detects the fact that the phase comparator 8 matched the phase of the input clocks and achieved a locked state. When the phase synchronization detection signal JST becomes H level while the DLL enable signal DLLEN is in an active state (H level), the frequency division ratio controller 10 sets the frequency division ratio control signal N8 to H level. As a result, the frequency division ratio of the frequency divider 4 is controlled so that it becomes larger. And when the DLL enable signal DLLEN once again becomes an active state (H level) after being in an inactive state (L level), the frequency division ratio controller 10 generates a one-shot pulse to a node N11 via inverters 82–84 and NAND gate 85, resets the output N12 of NAND gate 86, which was inputted with the phase synchronization detection signal JST, to H level, and controls the frequency division ratio control signal N8 so that it is forced to L level. As a result, the frequency division ratio of the frequency divider 4 is controlled so that it is forced lower.

The frequency division ratio of the frequency divider 4 is forced lower during the activation of the DLL enable signal DLLEN, and the phase comparator 8 performs phase comparison operations in response to high frequency input clocks N2, N6. Then, when the phases of the two clocks quickly match, as depicted by the solid lines in FIG. 11, the phase synchronization detection signal JST maintains an H level, and frequency division ratio control signal N8 once again becomes H level. And when the phases of the two clocks do not match up after a time, as depicted by the broken lines in FIG. 11, the frequency division ratio control signal N8 maintains an L level state for a predetermined time, and the phase comparator 8 performs phase comparison operations in response to high frequency clocks. Then, once input clock phase-matching is detected, and the phase synchronization detection signal JST becomes H level, the frequency division ratio control signal N8 becomes H level and the frequency division ratio of the frequency divider 4 becomes larger and the phase comparator 8 performs the operation in response to low frequency clocks.

Figure 12:
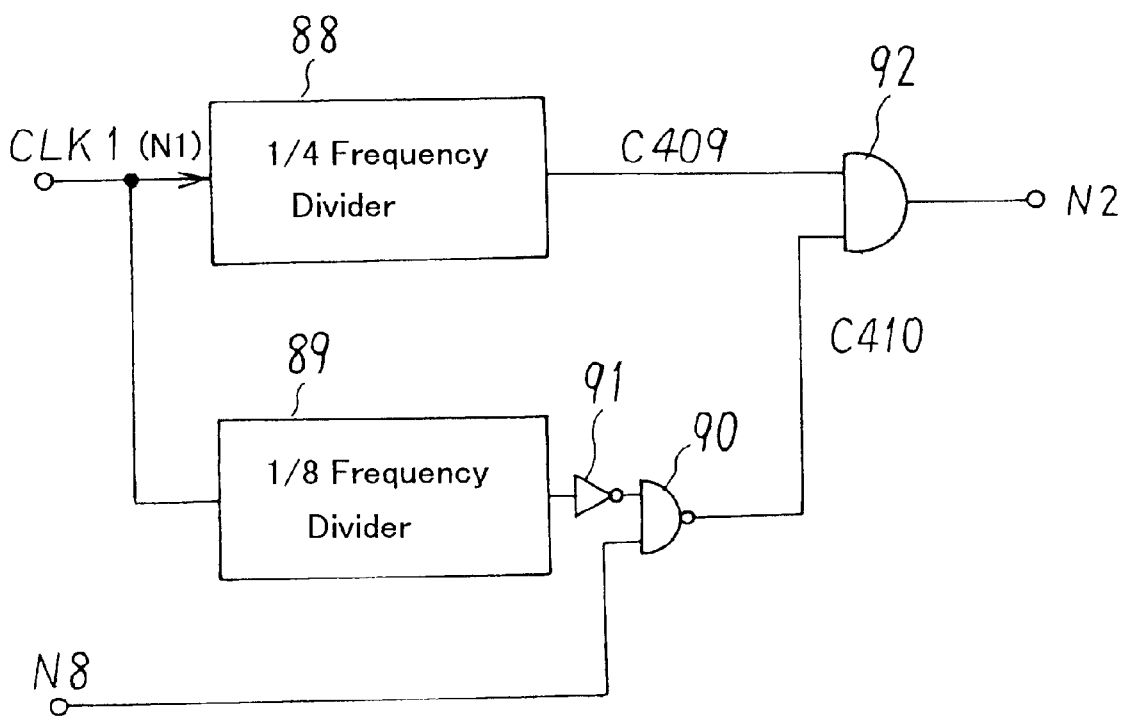
FIG. 12 is a circuit diagram of a frequency divider.

FIG. 12 is a circuit diagram of a frequency divider 4. The frequency divider 4 depicted in FIG. 12 is supplied with an internal clock CLK1 (N1), and is comprised of a ¼ frequency divider 88, which scales the frequency to one-fourth of its input frequency, and a ⅛ frequency divider 89, which scales the frequency to one-eighth of its input frequency. The ¼ frequency divider 88, for example, is achieved by fabricating a dual JK flip-flop configuration, and the ⅛ frequency divider 89 is achieved by fabricating a dual ¼ frequency divider 88 configuration. Then, the frequency divider 4 comprises NAND gate 90, inverter 91 and AND gate 92, and controls the frequency division ratio to 4 and 8 using the frequency division ratio control signal N8.

Figure 13:
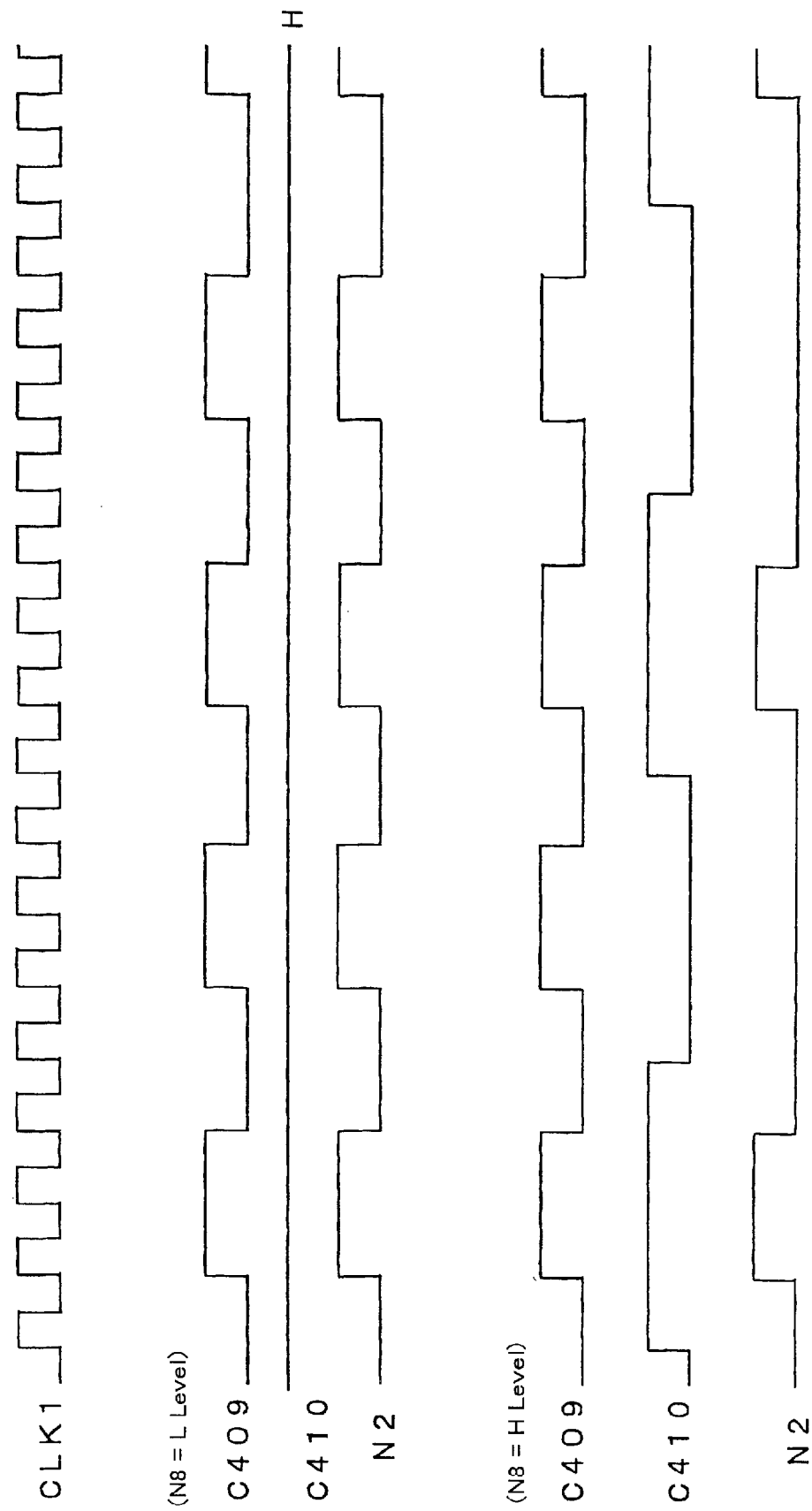
FIG. 13 is a waveform diagram depicting the operation of the frequency divider 4 depicted in FIG. 12.

FIG. 13 is a waveform diagram depicting the operation of the frequency divider 4 depicted in FIG. 12. The ¼ frequency divider 88 generates a ¼ frequency signal C409 relative to the internal clock CLK1, and the ⅛ frequency divider 89 generates a ⅛ frequency signal relative to the internal clock CLK1. Then, when the frequency division ratio control signal N8 is L level, the output C 410 of NAND gate 90 is forced to H level, and, in accordance with the H level of node C 410, the output C409 of the ¼ frequency divider 88 is output as a frequency divided clock N2 via AND gate 92. That is, the frequency division ratio of the frequency divider 4 is small, i.e. 4.

Also, when the frequency division ratio control signal N8 is H level, a one-eighth frequency clock from the ⅛ frequency divider 89 is output via inverter 91 and NAND gate 90. That is, output C410 is a clock with one-eighth the frequency of the internal clock CLK1. Then, outputs C409 and C410 are synthesized by AND gate 92, and a frequency-divided clock N2 is generated. The H level pulse width of this clock N2 is identical to that of clock N2 when the frequency division ratio control signal N8 is L level, and its frequency is one-eighth that of the internal clock CLK1.

As described above, the frequency divider 4 uses the frequency division ratio control signal N8 to fractionalize the frequency of the internal clock CLK1 with either a low frequency division ratio or a high frequency division ratio. Then, the frequency-divided clock N2 is supplied to the reference clock terminal of the phase comparator 8, as depicted in FIG. 3.

As is clear from the illustration of the phase comparator 8 depicted in FIG. 6, when the frequency of the supplied clock N2 is high, the frequency with which phase comparison operations are performed is also high, and changes in the delay control signal sent to the variable delay circuits 2, 5 occur frequently. By comparison, when the frequency of the clock N2 supplied to the phase comparator 8 is low, the frequency of phase comparison operations also drops. Therefore, lowering the frequency of the clock by increasing the frequency division ratio of the frequency divider 4 when the DLL circuit is locked makes it possible to hold down on the power consumption of the phase comparator 8, the delay controller 9 and the variable delay circuits 2, 5. Then, when memory is in an inactive state, without an internal clock being generated, the operation of the phase comparator 8 stops. However, when memory is reactivated (reset), the frequency division ratio of the frequency divider 4 is forced lower, the frequency with which the phase comparator 8 performs phase comparison operations increases, and it is possible to shorten the time until a lock state is achieved.

Figure 14:
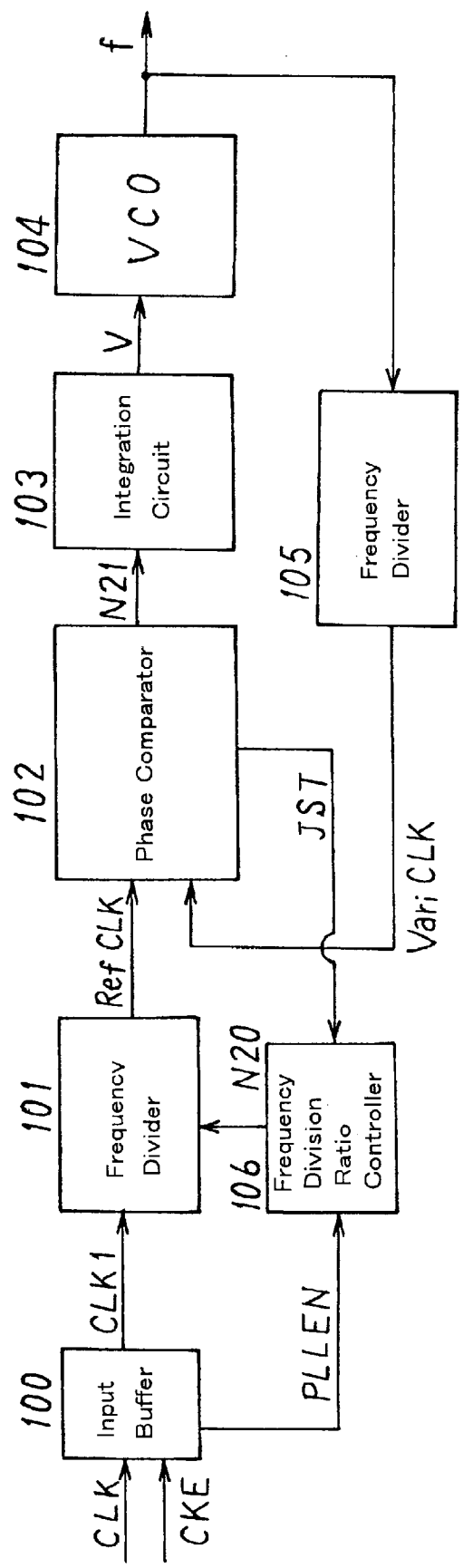
FIG. 14 depicts a PLL (Phase locked loop) circuit, which is another embodiment of the present invention.

FIG. 14 depicts a PLL (Phase locked loop) circuit, which is another embodiment of the present invention. The PLL circuit comprises a phase comparator 102, which compares the phases of a reference clock RefCLK and a variable clock VariCLK, an integration circuit 103, which generates a voltage V in accordance with a phase difference derived from the phase comparison result signal N21 of that phase comparator 102, a voltage-controlled oscillator 104, which generates the frequency of an internal clock f in accordance with the output voltage V of that integration circuit 103, and a frequency divider 105, which frequency divides that internal clock f.

When the phase of the variable clock VariCLK is fast relative to that of the reference clock RefCLK, an input voltage V is generated so as to lower the frequency of the internal clock f. When the phase of the variable clock VariCLK is slow relative to that of the reference clock RefCLK, an input voltage V is generated so as to heighten the frequency of the internal clock f. This approach generates an internal clock f, which is in phase synch with the reference clock RefCLK.

In this embodiment, the reference clock RefCLK is generated by using a frequency divider 101 to frequency divide an output clock CLK1 of an external clock-supplied input buffer 100. By giving the reference clock RefCLK a low frequency, it is possible to lower power consumption by lowering the frequency with which the phase comparator 102 operates.

In this embodiment as well, identical to the case of the DLL circuit described above, the phase comparator 102 generates a phase synchronization detection signal JST when the phases of both clocks match. Then, in response to this phase synchronization detection signal JST, a frequency division ratio controller 106 uses a control signal N20 to lower the frequency of the reference clock by further raising the frequency division ratio of the frequency divider 101. Also, the frequency division ratio controller 106 comprises the circuit architecture depicted in FIG. 10, and when the PLL enable signal PLLEN from the input buffer is reset so that it transitions from an inactive state to an active state, the frequency division ratio controller 106 resets the above-described phase synchronization detection signal JST, and, using the control signal N20, lowers the frequency division ratio of the frequency divider 101. As a result, the frequency with which the phase comparator 102 performs phase comparison operations increases, and the time required for the PLL circuit to lock on is shortened.

As described above, in accordance with the present invention, in an integrated circuit device comprising a circuit, which generates a control clock for realizing a prescribed circuit operation by synchronizing to the phase of a supplied clock, phase synchronization can be speeded up at integrated circuit device reset while curbing the power consumption of a control clock generator in an active state.

What is claimed is:

1. An integrated circuit device, comprising:
   a phase comparator, which compares the phase of a reference clock with that of a variable clock; and
   a frequency divider, which generates said reference clock by frequency dividing a supplied clock by a first frequency division ratio or a second frequency division ratio higher than the first frequency division ratio, wherein:
   said phase comparator generates a phase synchronization detection signal when the phase of said reference clock matches the phase of said variable clock;

said frequency divider frequency divides said supplied clock by said second frequency division ratio in response to said phase synchronization detection signal.

2. An integrated circuit device according to the claim 1, wherein at a reset when the integrated circuit device changes from an inactivation state to an activation state, said frequency divider performs frequency division using said first frequency division ratio so that said phase comparator performs phase comparison with a higher frequency at the reset.

3. An integrated circuit device, comprising:
a phase comparator, which compares the phase of a reference clock with that of a variable clock; and
a frequency divider, which generates said reference clock by frequency dividing a supplied clock, wherein:
said frequency divider frequency divides said supplied clock by a first frequency division ratio or a second frequency division ratio that is higher than the first frequency;
at a reset when the integrated circuit device changes from an inactivation state to an activation state, said frequency divider performs frequency division using said first frequency division ratio.

4. The integrated circuit device of claim 3,
further comprising a clock input circuit, which stops said supplied clock when in the inactive state, and stops the operation of the phase comparator when in said inactive state.

5. An integrated circuit device, comprising:
a control clock generator, which generates a control clock with a predetermined timing relative to the phase of a supplied clock, wherein:
said control clock generator comprises:
  a frequency divider, which frequency divides said supplied clock at a first frequency division ratio;
  a phase comparator, to which a frequency-divided clock frequency divided by said frequency divider is inputted as a reference clock, and to which a variable clock is also inputted, and which compares the phases of said reference clock and variable clock, generates a phase comparison result signal, and generates a phase synchronization detection signal when the phases of both clocks match;
  a first variable delay circuit, which delays said frequency-divided clock;
  a dummy delay circuit, which delays the output of said first variable delay circuit, and generates said variable clock;
  a second variable delay circuit, which delays said supplied clock, and generates said control clock; and
  a delay controller, which is responsive to said phase comparison result signal, and supplies a delay control signal to said first and second variable delay circuits so that the phases of said reference clock and variable clock match; wherein
  said frequency divider, in response to said phase synchronization signal, performs frequency division using a second frequency division ratio that is higher than said first frequency division ratio, and when an inactive state is changed to an active state at reset, said phase synchronization detection signal is reset so that said frequency divider performs frequency division using said first frequency division ratio, and said phase comparator performs phase comparison with a higher frequency at the reset.

6. The integrated circuit device of claims 5, wherein:
the integrated circuit device further comprises a clock input circuit, which stops said supplied clock when in an inactive state, and stops the operation of said phase comparator when in said inactive state.

7. An integrated circuit device, comprising:
a control clock generator, which generates a control clock with a predetermined timing relative to the phase of a supplied clock, wherein:
said control clock generator comprises:
  a frequency divider, which frequency divides said supplied clock at a first frequency division ratio;
  a phase comparator, to which a frequency-divided clock frequency divided by said frequency divider is inputted as a reference clock, and to which a variable clock is also inputted, and which compares the phases of said reference clock and variable clock, generates a phase comparison result signal, and generates a phase synchronization detection signal when the phases of both clocks match;
  a first variable delay circuit, which delays said frequency-divided clock;
  a dummy delay circuit, which delays the output of said first variable delay circuit, and generates said variable clock;
  a second variable delay circuit, which delays said supplied clock, and generates said control clock; and
  a delay controller, which is responsive to said phase comparison result signal, and supplies a delay control signal to said first and second variable delay circuits so that the phases of said reference clock and variable clock match; wherein
  said frequency divider, in response to said phase synchronization signal, performs frequency division using a second frequency division ratio that is higher than said first frequency division ratio so that the phase comparator performs phase comparison with a lower frequency.

8. An integrated circuit device, comprising:
a control clock generator, which generates a control clock with a predetermined timing relative to the phase of a supplied clock, wherein:
said control clock generator comprises:
  a frequency divider, which frequency divides said supplied clock at a first frequency division ratio or a second frequency division ratio higher than the first frequency division ratio;
  a phase comparator, to which a frequency-divided clock frequency divided by said frequency divider is inputted as a reference clock, and to which a variable clock is also inputted, and which compares the phases of said reference clock and variable clock, and generates a phase comparison result signal;
  a first variable delay circuit, which delays said frequency-divided clock;
  a dummy delay circuit, which delays the output of said first variable delay circuit, and generates said variable clock;
  a second variable delay circuit, which delays said supplied clock, and generates said control clock; and
  a delay controller, which is responsive to said phase comparison result signal, and supplies a delay control signal to said first and second variable delay circuits so that the phases of said reference clock and variable clock match; wherein
  said frequency divider, when an inactive state is changed to an active state at reset, performs frequency division using said first frequency division ratio so that said phase comparator performs phase comparison with a higher frequency at the reset.

9. An integrated circuit device, comprising:

a phase-locked loop (PLL), which generates an internal clock in phase synch with a supplied clock, wherein:

said PLL comprises:

a frequency divider, which frequency divides said supplied clock using a first frequency division ratio;

a phase comparator, to which a frequency-divided clock frequency divided by said frequency divider is inputted as a reference clock, and to which a variable clock corresponding to said internal clock is also inputted, and which compares the phases of said reference clock and variable clock, generates a phase comparison result signal, and generates a phase synchronization detection signal when the phases of both clocks match;

an integration circuit, which generates a signal corresponding to the phase difference of said reference clock and variable clock in response to said phase comparison result signal; and an oscillation circuit, which generates said internal clock having a frequency in accordance with said signal corresponding to the phase difference; wherein said frequency divider, in response to said phase synchronization signal, performs frequency division using a second frequency division ratio that is higher than said first frequency division ratio, and when an inactive state is changed to an active state at reset, said phase synchronization detection signal is reset so that said frequency divider performs frequency division using said first frequency division ratio, and said phase comparator performs phase comparison with a higher frequency at the reset.

10. The integrated circuit device of claims 9, wherein:

the integrated circuit device further comprises a clock input circuit, which stops said supplied clock when in an inactive state, and stops the operation of said phase comparator when in said inactive state.

* * * * *